United States Patent [19]
Seavey

[11] Patent Number: 5,510,722
[45] Date of Patent: Apr. 23, 1996

[54] TEST FIXTURE FOR PRINTED CIRCUIT BOARDS

[75] Inventor: Bruce A. Seavey, North Attleboro, Mass.

[73] Assignee: TTI Testron, Inc., Woonsocket, R.I.

[21] Appl. No.: 992,578

[22] Filed: Dec. 18, 1992

[51] Int. Cl.⁶ .............................. G01R 31/02; H01R 4/64
[52] U.S. Cl. .......................................... 324/758; 324/73.1
[58] Field of Search ................................. 324/158 P, 73, 324/158 F, 750–765; 339/117 P

[56] References Cited

U.S. PATENT DOCUMENTS

| | | | |
|---|---|---|---|
| 4,352,061 | 9/1982 | Matrone | 324/158 F |
| 4,884,024 | 11/1989 | DiPerna | 324/763 |
| 5,304,921 | 4/1994 | Cook et al. | 324/158 F |

*Primary Examiner*—Kenneth A. Wieder
*Assistant Examiner*—Barry C. Bowser
*Attorney, Agent, or Firm*—Salter & Michaelson

[57] ABSTRACT

A test fixture for testing printed circuit boards on a test computer includes a base, a probe plate on the base and a top plate in spaced relation above the probe plate. The probe plate has a predetermined array of spring loaded primary contact probes mounted therein, and the top plate has a plurality of secondary contact probes mounted therein in alignment with and in the same predetermined array as the primary contact probes in the probe plate. The top plate is adapted for receiving and positioning a printed circuit board thereon so that predetermined areas of the printed circuit board are aligned with the secondary contact probes, and the fixture is actuatable for drawing the top plate toward the probe plate to cause the primary contacts to engage the secondary contacts and to thereby move the secondary contacts into engagement with the predetermined areas of the printed circuit board.

4 Claims, 2 Drawing Sheets

TEST FIXTURE FOR PRINTED CIRCUIT BOARDS

BACKGROUND AND SUMMARY OF INVENTION

The instant invention relates to test fixtures for use in testing printed circuit boards on test computers and more particularly to a test fixture which is operative for contacting predetermined areas of a printed circuit board with increased accuracy and reliability in order to more effectively test the printed circuit board on a test computer.

A variety of different types of test fixtures have been heretofore available for testing printed circuit boards on test computers. In general, however, most of the previously available test fixtures have been of a type including a base, a probe plate mounted on the base, a plurality of spring loaded electrical contact probes mounted on the probe plate in a predetermined array, and a top plate mounted on the base in upwardly spaced relation to the probe plate. The top plate of a fixture of this type is normally adapted for receiving and positioning a predetermined printed circuit board thereon so that predetermined portions of the printed circuit board are aligned with the contact probes on the probe plate. Further, the top plate of a fixture of this type generally has a plurality of apertures therein which are aligned with the contact probes, and the top plate is normally adapted to be moved between a first position of predetermined spaced relation to the probe plate and a second position of more closely spaced relation thereto. More specifically, a test fixture of this type is generally adapted so that the top plate thereof is movable downwardly to a second position wherein the contact probes on the probe plate pass through the apertures in the top plate and electrically contact the predetermined areas on the printed circuit board in order to electrically connect the printed circuit board to a test computer electrically connected to the contact probes.

While it has been found that test fixtures of the above type are generally effective for testing printed circuit boards, it has been found that in some instances the contact probes of a fixture of the above type can be less than entirely effective for reliably and accurately contacting the appropriate areas of a printed circuit board received on the top plate thereof. This is because it is generally necessary for the spring loaded contact probes of a test fixture of the above type to extend a substantial distance, such as three quarter of an inch or more, from the probe plate thereof in order to pass through apertures in the top plate thereof and contact a printed circuit board received on the top plate. In this regard, it has generally been found that relatively minor manufacturing irregularities can cause the contact probes of a test fixture to improperly contact, or even miss, the appropriate areas of a printed circuit board during a test operation. These irregularities can be caused by radial play in the tip portions of the probes on a probe plate, misregistration errors between the top plate and the probe plate of a fixture or minor drilling or mounting errors which cause the test probes on a probe plate to be mounted at incorrect angles thereon. In any event, it has been found that these minor imperfections can frequently present problems in the accuracy with which the test probes of a test fixture are capable of reliably contacting a printed circuit board during a testing operation.

The instant invention provides a significant improvement in printed circuit board testing devices which virtually eliminates the problems which have been heretofore experienced with respect to accurately and reliably testing printed circuit boards with test fixtures. More specifically, the instant invention provides an improved printed circuit board test fixture which is not effected by minor irregularities in probe mounting, probe tolerances or probe plate registration. Still more specifically, the test fixture of the instant invention comprises a base, a probe plate mounted on the base, and a plurality of primary electrical contact probes on the probe plate which are disposed in a predetermined array and adapted to be electrically connected to a test computer. The test fixture further comprises a top plate mounted on the base in substantially parallel relation to the probe plate and a plurality of secondary electrical contact probes mounted on the top plate. The top plate is adapted so that it is operative for receiving and positioning a printed circuit board thereon, whereby predetermined portions of the printed circuit board are substantially aligned with predetermined primary contact probes on the probe plate. The top plate is further adapted so that it is movable between a first position of a predetermined spaced relation to the probe plate and a second position of more closely spaced relation thereto. The secondary electrical contact probes are mounted on the top plate so that they are disposed in the same predetermined array as the primary electrical contact probes, and the secondary probes are aligned with the primary contact probes. Further, the secondary contact probes include contact portions which are movable between first positions of spaced disengagement from the predetermined portions of the printed circuit board and second positions of engagement therewith. The primary contact probes are disposed in spaced relation to the secondary contact probes when the top plate is in the first position thereof, and the primary probes engage the secondary probes to move the contact portions thereof from the first positions thereof to the second positions thereof when the top plate is moved from the first position thereof to the second position thereof. Accordingly, when the top plate is moved downwardly from the first position thereof to the second position thereof, the secondary contact probes are moved into engagement with the primary contact probes to move the contact portions of the secondary probes into engagement with the predetermined portions of a printed circuit board received on the top plate.

The secondary probes preferably comprise sleeve portions which are mounted in the top plate, and the contact portions of the contact probes preferably travel in the sleeve portions between the first and second positions thereof. The contact portions are preferably freely slidable in the sleeve portions thereof, but they are preferably gravitationally biased toward the first positions thereof. Further, the secondary contact probes are preferably adapted so that the contact portions thereof travel within predetermined limits of travel in the sleeve portions thereof. Each of the contact portions preferably includes a pointed contact head which is engagable with a printed circuit board received on the top plate, and each of the contact portions preferably further includes an enlarged rear end portion which is adapted to be engaged by the primary contact aligned therewith for moving the contact portions of the secondary contacts between the first and second positions thereof.

It has been found that the test fixture of the instant invention represents a significant improvement over the heretofore available test fixtures as far as eliminating the problems of accurately electrically connecting predetermined portions of a printed circuit board to a test computer. Specifically, it has been found that because the primary contact probes are merely required to contact the enlarged rear end portions of the secondary contact probes rather than being required to pass through apertures in the top plate and then directly contact a printed circuit board, the relative distances traveled by the top plate, as it is moved to the second position thereof, is greatly reduced so that the effects of minor imperfections in probe angularity, probe construction or top plate registration are minimized. Further, because the contact portions of the secondary contact probes are merely required to travel relatively short distances to contact a printed circuit board, minor imperfections in probe angularity or construction with respect to the secondary contact probes are of relatively minor significance.

Accordingly, it is primary object of the instant invention to provide an improved test fixture for reliably and accurately electrically connecting a printed circuit board to a test computer.

Another object of the instant invention is to provide an improved test fixture which is not significantly effected by minor irregularities in contact probe construction, contact probe mounting or top plate alignment.

Another object of the instant invention is to provide an improved test fixture for testing a printed circuit board which comprises a top plate having a plurality of secondary contact probes mounted therein for reliably contacting predetermined areas of a printed circuit board.

Other objects, features and advantages of the invention shall become apparent as the description thereof proceeds when considered in connection with the accompanying illustrative drawings.

DESCRIPTION OF THE DRAWINGS

In the drawings which illustrate the best mode presently contemplated for carrying out the present invention.

DESCRIPTION OF THE INVENTION

Figure 1:
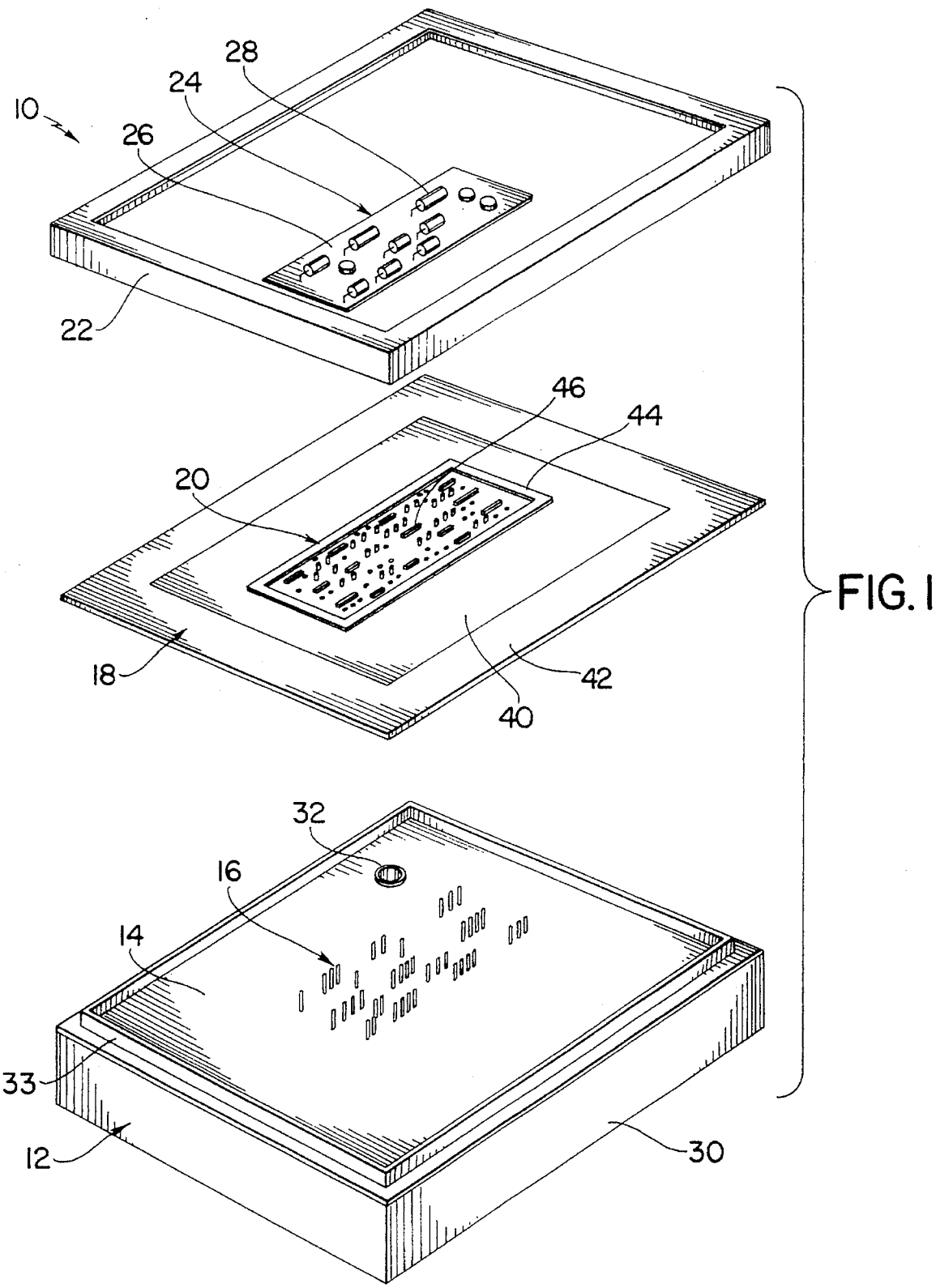
FIG. 1 is an exploded perspective view of the test fixture of the instant invention with a printed circuit board.
Figure 2:
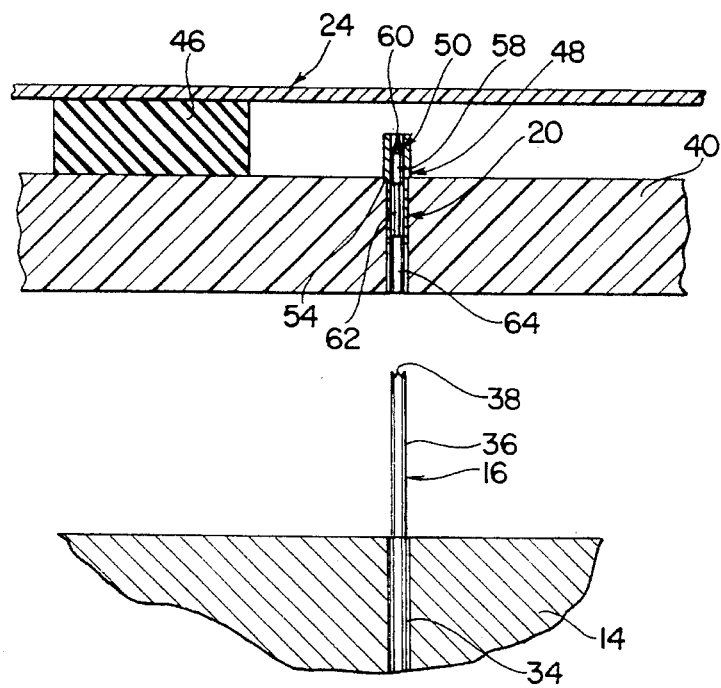
FIG. 2 is an enlarged fragmentary cross-sectional view illustrating one of the primary contact probes and one of the secondary contact probes with the top plate and the secondary probe in the first positions thereof.
Figure 3:
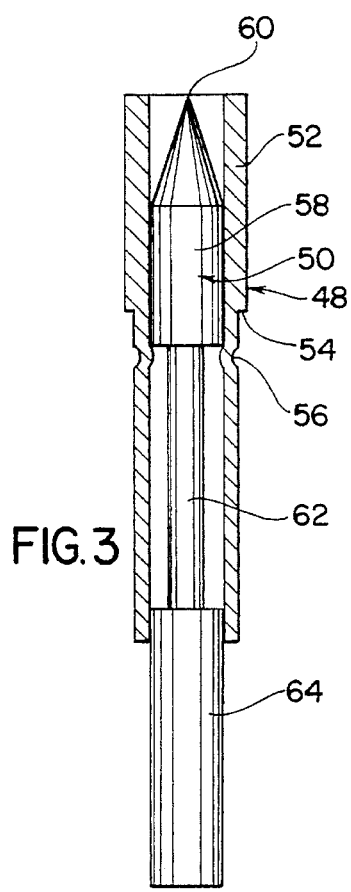
FIG. 3 is a greatly enlarged cross-sectional view of one of the secondary contact probes in the first position thereof.
Figure 4:
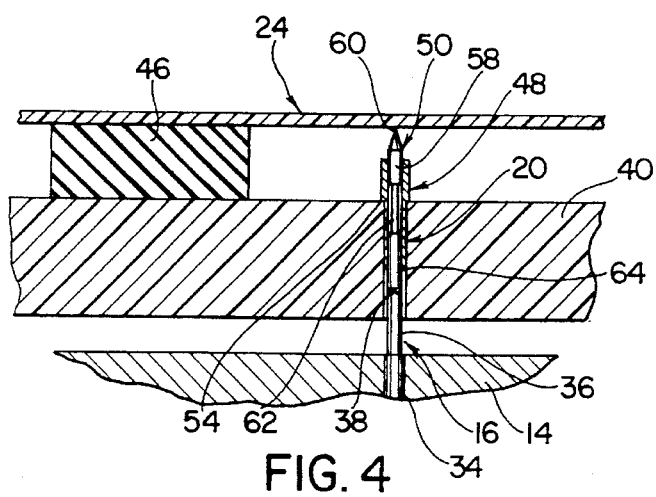
FIG. 4 is a view similar to FIG. 2 with the secondary contact probe and the top plate in the second positions thereof.
Figure 5:
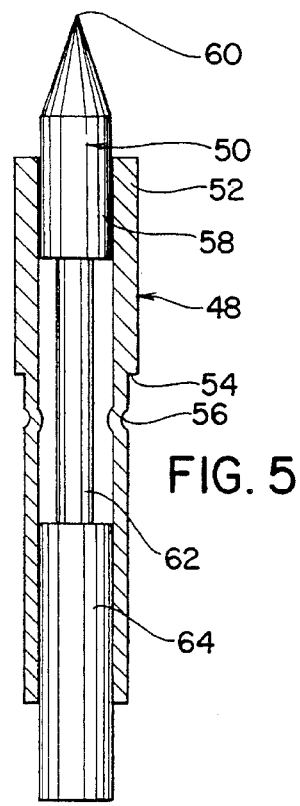
FIG. 5 is a view similar to FIG. 3 with the secondary contact probe in the second position thereof.

Referring now to the drawings, the test fixture of the instant invention is illustrated in FIGS. 1 through 5 and generally indicated at 10 in FIG. 1. The test fixture 10 comprises a base generally indicated at 12, a probe plate 14 mounted on the base 12, a plurality of primary contact probes generally indicated at 16 mounted on the probe plate 14, a top plate generally indicated at 18, a plurality of secondary contact probes generally indicated at 20 on the top plate 18 and an upper frame 22. The apparatus 10 is adapted for receiving a printed circuit board generally indicated at 24 thereon in order to electrically connect the printed circuit board 24 to a test computer (not shown) for the purpose of testing the printed circuit board 24 prior to use. However, because the apparatus 10 includes both the primary contact probes 16 and the secondary contact probes 20, it is operative for more accurately and reliably connecting the printed circuit board 24 to a test computer than is possible with the heretofore available test fixtures, as will hereinafter be more fully set forth.

The printed circuit board 24 is of conventional construction, and it includes a base or plate portion 26 and a plurality of electrical components 28 which are assembled and electrically connected on the plate portion 26 in a conventional manner.

The base 12 is of generally conventional construction and it is adapted to be received on a conventional test computer (not shown) in a conventional manner. The base 12 includes a peripheral wall assembly 30 and a vacuum assembly 32 which is adapted to be connected to a suitable source of vacuum for actuating the test fixture 10 in a conventional manner. However, while the test fixture 10 as herein embodied comprises a vacuum actuated test fixture, it will be understood that the instant invention is also applicable to test fixtures which include various other types of actuating means.

The probe plate 14 is also of generally conventional construction and it is mounted in the base 12 so that it extends across the interior thereof in the manner illustrated. The probe plate 14 includes a main plate portion which is preferably made from a nonconductive fiberglass composite and secured in sealing substantially air tight engagement with the wall portion 30 in a conventional manner. The probe plate 14 also includes an elastomeric peripheral support element 33 for supporting the top plate 18 thereon in a conventional manner.

The primary contact probes 16 are of also of conventional construction, and they are adapted to be electrically connected to a test computer in a conventional manner. Each of the primary contact probes 16 comprises a tubular outer casing 34 and a contact member 36 which is received in telescoping relation in the casing 34 thereof and spring loaded or outwardly biased to the upwardly extending position illustrated in FIG. 2. Each of the contact members 36 has a knurled upper terminal end 38 which is adapted to electrically connect the probe 16 thereof to an element contacted by the terminal end 38 in a conventional manner.

The top plate 18 comprises a center portion 40, which is preferably made from a substantially rigid nonconductive fiberglass, and a peripheral portion 42 which is preferably made from an elastomeric sheet material and sealing secured to the center portion 40. The top plate 18 further comprises a circuit board frame portion 44 which is preferably also made from an elastomeric material and which is adapted for receiving the circuit board 24 in sealing engagement thereon. The circuit board frame portion 44 is also adapted so that it defines an enclosed contact area where the fixture 10 can be electrically connected to various predetermined areas of the circuit board 24. In addition, a plurality of elastomeric support pads 46 are provided in the interior of the area defined by the frame portion 44 for supporting the plate or base portion 26 of the circuit board 24.

The secondary contact probes 20 are illustrated most clearly in FIGS. 2 through 5, and they are mounted in the contact area of the top plate 18 defined by the frame portion 44. Each of the secondary contact probes 20 comprises a tubular outer sleeve portion 48 and a contact portion generally indicated at 50. Each of the sleeve portions 48 has an enlarged upper portion 52 which extends to a shoulder 54 and abutment means in the form of a recessed annular ring 56 is formed in each of the sleeve portions 50 below the shoulder 54 thereof. Each of the contact portions 50 includes an enlarged upper head portion 58 which terminates in a pointed end 60, a reduced intermediate portion 62, and an enlarged rear end portion 64. Each of the contact portions 50 is received in the sleeve portion 48 thereof so that the contact portion 50 of each of the secondary contact probes 20 is freely slidable in the respective sleeve portion 48 thereof between a first position, wherein the rear end of the enlarged head portion 58 thereof engages the inner surface of the recessed annular ring 56 and a second position, wherein the forward end of the enlarged end portion 64 thereof engages the inner surface of the recessed annular ring 56. Accordingly, the contact portion 50 of each of the secondary contact probes 20 is movable between the first or retracted position illustrated in FIG. 3 and various extended positions, including the one illustrated in FIGS. 4 and 5. Each of the secondary contact probes 20 is snugly and sealingly received in an aperture in the portion of the central 40 of the top plate 18 defined by the frame portion 44 so that each of the secondary contact probes 20 is aligned with one of the primary contact probes 16. Further, since the test fixture 10 is specifically designed for use in combination with the printed circuit board 24, each of the secondary contact probes 20 is also aligned with a predetermined area on the under side of the printed circuit board 24 when the printed circuit board 24 is received on the top plate 18 and positioned in the frame portion 44.

The upper frame portion 22 is operative for securing the top plate portion 18 to the housing 12 in a conventional manner. Specifically, the top plate portion 18 is received and supported on the peripheral support element 33, and the upper frame portion 22 is received and secured on the peripheral diaphragm portion 42 of the top plate portion 18 for securing the top plate portion 18 on the face portion 12 in a conventional manner.

Accordingly, for use and operation of the apparatus 10 a printed circuit board 24 is assembled in the frame portion 44 on the top plate 18. Thereafter, a vacuum is applied to the area of the fixture 10 between the top plate 18 and the probe plate 14 to draw the center portion 40 of the top plate 18 downwardly by slightly deforming the peripheral or diaphragm portion 42 of the top plate 18. As the center portion 40 with the printed circuit board 24 is drawn downwardly, the rear end portions 64 of the secondary contact probes 20 are brought into engagement with the terminal ends 38 of the primary contact probes 20 so that the contact portions 50 of the secondary contact probes 20 are moved upwardly into engagement with predetermined areas of the printed circuit board 24. In this regard, because it is only necessary to move the center portion 40 downwardly a short distance before the primary contact probes 16 engage the secondary contact probes 20, minor imperfections in the primary contact probes 16 and in the mounting of the primary contact probes 16 on the probe plate 14 are significantly less critical than with conventional fixtures, and in most instances the upper ends 38 of the primary contact probes 16 can still make effective electrical contact with the lower end portions 64 of the contact portions 50. Further, the primary contact probes 16 are still able to move the contact portions 50 of the secondary contact probes 20 upwardly until the pointed ends 60 engage the appropriate areas of the printed circuit board 24. Similarly, minor registration problems between the top plate 18 and the probe plate 14 are less critical, and in most instances the primary contact probes 16 can still effectively engage the secondary probes 20 to both move the secondary probes 20 upwardly into engagement with the appropriate areas of the printed circuit board 24 and to electrically connect the primary contact probes 16 to the printed circuit board 24 through the secondary contact probes 20.

It is seen therefore that the instant invention provides an effective test fixture for a printed circuit board. The test fixture 10 is capable of reliably and accurately providing an interface between the printed circuit board 24 and a test computer. In this regard, because the test fixture 10 includes both the primary contact probes 16 and the secondary contact probes 20, it is capable of compensating for minor imperfections in the construction and/or mounting of the primary contact probes 16 as well as minor imperfections in the registration of the top plate 18 relative to the probe plate 14. Hence, the test fixture 10 is capable of more accurately and reliably contacting the appropriate areas of the printed circuit board 24 in order to electrically connect the printed circuit board 24 to a test computer. Hence, it is seen that the test fixture of the instant invention represents a significant improvement in the art relating to test apparatus which has substantial commercial significance.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

What is claimed:

1. A test fixture for testing a printed circuit board on a test computer comprising:

(a) a base;

(b) a probe plate mounted on said base;

(c) a plurality of spring loaded primary electrical contact probes mounted in said probe plate, said primary contact probes being disposed in a predetermined array and being adapted to be electrically connected to said test computer;

(d) a top plate mounted on said base in substantially parallel relation above said probe plate, said top plate having means for receiving and positioning said printed circuit board thereon so that predetermined portions of said printed circuit board are aligned with predetermined primary contact probes in said array of primary contact probes, said top plate being movable between a first position of predetermined spaced relation to said probe plate and a second position of more closely spaced relation thereto; and (e) a plurality of secondary electrical contact probes which are slidably mounted in said top plate, said secondary contact probes also being disposed in said predetermined array and being aligned with said primary contact probes, said secondary contact probes including sleeve portions mounted in said top plate and contact portions which are slidably movable within the sleeve portion between first positions of closely spaced disengagement from said predetermined portions of said printed circuit board and second positions of engagement therewith, said contact portions being freely slidable in said sleeve portions but being gravitationally biased toward said first positions thereof;

(f) said primary contact probes being in spaced relation to said secondary contact probes when said top plate is in the first position thereof and engaging said secondary contact probes to both electrically connect said primary contact probes to said secondary contact probes and move the contact portions of said secondary contact probes from the first positions thereof to the second positions thereof when said top plate is moved from the first position thereof to the second position thereof.

2. In the test fixture of claim 1, the contact portions of said secondary contact probes traveling within predetermined limits of travel.

3. In the test fixture of claim 1, said sleeve portions having abutment means for limiting the travel of said contact portions within said sleeve portions.

4. In the test fixture of claim 3, said abutment means comprising an inwardly extending annular ring in said sleeve portions.

* * * * *